United States Patent [19]
Terada et al.

[11] Patent Number: 5,933,384
[45] Date of Patent: Aug. 3, 1999

[54] SEMICONDUCTOR INTEGRATED CIRCUIT

[75] Inventors: Yutaka Terada; Toru Iwata, both of Osaka, Japan

[73] Assignee: Matsushita Electric Industrial Co., Ltd., Japan

[21] Appl. No.: 08/997,558

[22] Filed: Dec. 23, 1997

[30] Foreign Application Priority Data

Dec. 27, 1996 [JP] Japan ................................ 8-350227

[51] Int. Cl.[6] .................................................. G11C 7/00
[52] U.S. Cl. ........................... 365/227; 365/226; 365/229
[58] Field of Search ................................ 365/227, 226, 365/229

[56] References Cited

U.S. PATENT DOCUMENTS 5,410,278  4/1995  Itoh et al. ........................... 365/227 X
5,726,946  3/1998  Yamagata et al. ....................... 365/226

FOREIGN PATENT DOCUMENTS 06029834  4/1994  Japan .
06208790  7/1994  Japan .

*Primary Examiner*—Huan Hoang
*Attorney, Agent, or Firm*—McDermott, Will & Emery

[57] ABSTRACT

In serially connected first and third inverters, the high-level-side source nodes are connected to a first pseudo-power supply line and the low-level-side source nodes are connected to a third pseudo-power supply line. In serially connected second and fourth inverters, the high-level-side source nodes are connected to a second pseudo-power supply line and the low-level-side source nodes are connected to a fourth pseudo-power supply line. The source nodes of transistors which are cut off in the operation mode, are disconnected from the power supply when first to fourth switch transistors are turned off according to an input signal, and these source nodes are short-circuited when either of fifth and sixth switch transistors is turned on.

10 Claims, 9 Drawing Sheets

SEMICONDUCTOR INTEGRATED CIRCUIT

BACKGROUND OF THE INVENTION

The present invention relates to a semiconductor integrated circuit having both an operation mode large in power consumption and a standby mode small in power consumption, and more particularly to a semiconductor integrated circuit reduced in power consumption when it operates at a low voltage.

With the spread of portable devices and in view of energy saving, a reduction in power consumption is recently demanded for a semiconductor integrated circuit (hereinafter referred to as LSI). To reduce an LSI in power consumption, it is effective to lower the power supply voltage. Further, to assure the reliability of a transistor of which miniaturization is progressed, a reduction in power supply voltage becomes an essential condition in LSI designing. Conventionally, the inside power supply of an LSI is mainly set to 3 to 5 V, but an LSI operable at 0.8 V~1.5 V is now desired for a battery-driven LSI. On the other hand, each of the MOS transistors forming an LSI has a threshold voltage. When the power supply voltage is lowered and approaches the predetermined threshold voltage of each transistor, the drive ability of each transistor is lowered to lower the drive current thereof. This lowers the LSI in performance. In this connection, to provide a predetermined performance even at a low voltage, there are used low-threshold transistors higher in drive current. However, low-threshold transistors are high in drive current at a low voltage and also high in off-leak current in the standby mode. This increases the current in the standby mode to increase the power consumption, resulting in a failure to achieve the original object of a reduction in power consumption. In this connection, there have been proposed MTCMOS transistors disclosed by Japanese Patent Laid-Open Publication No. 6-29834, in which high-threshold transistors are disposed between the power supply and a circuit formed by low-threshold transistors and in which the off-leak current is reduced in the standby mode by turning off these high-threshold transistors.

As another method of reducing the off-leak current, there is available a method disclosed by Japanese Patent Laid-Open Publication No. 6-208790, with the object of reducing the off-leak current in the standby mode.

However, any of the conventional semiconductor integrated circuits can reduce only the off-leak current in the standby mode and disadvantageously generates a feedthrough leak current together with charging and discharging currents in the operation mode. This is particularly remarkable in a circuit in which the operation period of time is long or which operates in a region relatively high in frequency, because the influence in the operation mode is greater.

SUMMARY OF THE INVENTION

The present invention is proposed in view of the foregoing. It is a first object of the present invention to reduce the power consumption not only in the standby mode but also in the operation mode even though the inside power supply is reduced in voltage.

It is a second object of the present invention to enable a high-speed operation to be achieved even though the inside power supply is reduced in voltage.

The present invention has been accomplished with attention placed on the following. That is, the main reason why a leak current flows in the operation mode is because the power supply potential and the grounding potential are applied to the cells such as logic elements or the like. Thus, to lower the leak current, it is essential to reduce the difference between the power supply potential and the grounding potential applied to the cells, to such an extent which does not interferes with the transmission of each output signal.

To achieve the first object, the present invention provides a method of driving a semiconductor integrated circuit having a logic circuit comprising a plurality of elements, and this method comprises a power supply voltage changing step of changing, according to the state of an input signal in the operation mode, the power supply voltage of each element which is included in the plurality of elements and which is substantially brought into a cutoff state, such that the drive ability of the above-mentioned element is reduced.

According to the semiconductor integrated circuit drive method of the present invention, the power supply voltage of each element which is included in the plurality of elements and which is substantially brought into a cutoff state, is changed such that the drive ability of the above-mentioned element is reduced. This reduces the feedthrough leak current generated in the logic circuit in the operation mode. This reduces the leak current not only in the standby mode but also in the operation mode. This results in a reduction in power consumption in the operation mode.

According to the semiconductor integrated circuit drive method of the present invention, the power supply voltage changing step preferably comprises a step of decreasing the power supply voltage or a step of increasing the power supply voltage. With such an arrangement, the voltage decreasing step is effective for reduction in leak current when each element driven by the higher-side potential is brought into a cutoff state, and the voltage increasing step is effective for reduction in leak current when each element driven by the lower-side potential is brought into a cutoff state. This securely reduces the leak current in the operation mode. Further, in a logic circuit in which the value of either higher-side potential or lower-side potential has a logic, the potential of each element substantially in the cutoff state, is equal to an intermediate potential between the higher-side potential and the lower-side potential. This hastens determination of a logic when an operation starts, enabling the circuit to be operated at higher speed. Thus, the second object can be achieved.

According to the semiconductor integrated circuit drive method of the present invention, the power supply voltage is preferably a first power supply voltage higher than the grounding potential or a second power supply voltage lower than the grounding potential, and the power supply voltage changing step preferably comprises: a step of changing the first power supply voltage to a third power supply voltage smaller than the first power supply voltage, or a step of changing the second power supply voltage to a fourth power supply voltage larger than the second power supply voltage. With such an arrangement, the step of changing the first power supply voltage to the third power supply voltage smaller than the first power supply voltage, is effective for reduction in leak current when each element which is included in the plurality of elements of the logic circuit and which is driven by the first power supply voltage serving as the higher-side potential, is brought into a cutoff state, and the step of changing the second power supply voltage to the fourth power supply voltage larger than the second power supply voltage, is effective for reduction in leak current when each element which is included in the plurality of elements of the logic circuit and which is driven by the second power supply voltage serving as the lower-side potential, is brought into a cutoff state. This securely reduces the leak current in the operation mode. Further, in a logic circuit in which the value of either higher-side potential or lower-side potential has a logic, the potential of each element substantially in the cutoff state is equal to an intermediate potential between the higher-side potential and the lower-side potential. This hastens determination of a logic when an operation starts, enabling the circuit operation to be executed at higher speed.

Preferably, the semiconductor integrated circuit drive method of the present invention further comprises a step of making the value of the third power supply voltage equal to the value of the fourth power supply voltage. With such an arrangement, there can simultaneously be set the third power supply voltage obtained by decreasing the first power supply voltage serving as the higher-side potential and the fourth power supply voltage obtained by increasing the second power supply voltage serving as the lower-side potential. This not only securely generates an intermediate potential between the higher-side potential and the lower-side potential, but also eliminates the generation of two different intermediate potentials. This results in simplification of the circuit.

In the semiconductor integrated circuit drive method of the present invention, the logic circuit is preferably connected to a first power supply line to which the first power supply voltage is applied, and to a second power supply line to which the second power supply voltage is applied, and the power supply voltage changing step preferably comprises a step of stopping the application of the first power supply voltage to the first power supply line, stopping the application of the second power supply voltage to the second power supply line, and then connecting the first and second power supply lines to each other. With such an arrangement, the higher-side potential is decreased and the lower-side potential is increased, and each of the decreased and increased potentials becomes the same potential having an intermediate value between the first power supply voltage and the second power supply voltage. This not only securely generates a potential having an intermediate value between the higher-side potential and the lower-side potential, but also eliminates the generation of two different intermediate potentials. This results in simplification of the circuit.

To achieve the first object, the present invention provides a first semiconductor integrated circuit having a logic circuit comprising a plurality of elements, and this semiconductor integrated circuit comprises power supply voltage changing means for changing, according to the state of an input signal in the operation mode, the power supply voltage of each element which is included in the plurality of elements and which is substantially brought into a cutoff state, such that the drive ability of the above-mentioned element is reduced.

According to the first semiconductor integrated circuit, the power supply voltage changing means changes the power supply voltage of each element which is included in the plurality of elements and which is substantially brought into a cutoff state in the operation mode, such that the drive ability of the above-mentioned element is reduced. This reduces the feedthrough leak current generated in the logic circuit in the operation mode. This reduces the leak current not only in the standby mode but also in the operation mode. This result in a reduction in power consumption in the operation mode.

According to the first semiconductor integrated circuit, the power supply voltage changing means preferably comprises: a voltage decreasing unit connected to the logic circuit for decreasing, according to the state of an input signal in the operation mode, a first power supply voltage of each element which is included in the plurality of elements and which is substantially brought into a cutoff state, to a third power supply voltage such that the drive ability of the above-mentioned element is reduced; and a voltage increasing unit connected to the logic circuit for increasing, according to the state of an input signal in the operation mode, a second power supply voltage of each element which is included in the plurality of elements and which is substantially brought into a cutoff state, to a fourth power supply voltage such that the drive ability of the above-mentioned element is reduced. With such an arrangement, when each element which is included in the plurality of elements in the logic circuit and which is driven by the higher-side potential, is substantially brought into a cutoff state, the voltage decreasing unit decreases the power supply voltage of the above-mentioned element. Also, when each element which is included in the plurality of elements in the logic circuit and which is driven by the lower-side potential, is substantially brought into a cutoff state, the voltage increasing unit increases the power supply voltage of the above-mentioned element. This securely reduces the leak current in the operation mode.

Further, in a logic circuit in which the value of either higher-side potential or lower-side potential has a logic, the potential of each element substantially in the cutoff state is equal to a potential having an intermediate value between the higher-side potential and the lower-side potential. This hastens determination of a logic when an operation starts, enabling the circuit operation to be executed at higher speed. Thus, the second object can be achieved.

According to the first semiconductor integrated circuit, the value of the third power supply voltage is preferably equal to the value of the fourth power supply voltage.

According to the first semiconductor integrated circuit, the logic circuit is preferably connected to a first power supply line to which the first power supply voltage is applied, and to a second power supply line to which the second power supply voltage is applied, and each of the voltage decreasing unit and the voltage increasing unit is preferably connected between the first and second power supply lines and preferably has a switch for opening and closing the electrical connection between the first and second power supply lines. With such an arrangement, there can securely be generated a single potential having an intermediate value between the first and second power supply voltages.

Preferably, the first semiconductor integrated circuit of the present invention is arranged in the following manner. There are further disposed (i) a first power supply line to which the first power supply voltage is applied, (ii) a second power supply line to which the second power supply voltage is applied and (iii) first and second pseudo-power supply lines connected to each of the voltage decreasing unit and the voltage increasing unit. The logic circuit is connected to the first and second pseudo-power supply line. Each of the voltage decreasing unit and the voltage increasing unit comprises (i) a first switch connected between the first power supply line and the first pseudo-power supply line, (ii) a second switch connected between the second power supply line and the second pseudo-power supply line and (iii) a third switch connected between the first and second pseudo-power supply lines. With such an arrangement, when the first and second switches are turned off and the third switch is turned on for each element which is included in the plurality of elements in the logic circuit and which is substantially brought into the cutoff state, there can securely be generated a potential having an intermediate value between the first and second power supply voltages.

According to the first semiconductor integrated circuit, the first power supply voltage preferably has the power supply potential, and the second power supply voltage preferably has the grounding potential. With such an arrangement, the logic circuit can securely be operated.

To achieve the first and second objects, the present invention provides a second semiconductor integrated circuit comprising: a plurality of logic circuits each comprising a plurality of elements; a first power supply line to which applied is a first power supply voltage higher than the grounding potential, and a second power supply line to which applied is a second power supply voltage lower than the grounding potential; voltage decreasing means connected to each of the logic circuits for decreasing the first power supply voltage according to the state of an input signal in the operation mode; voltage increasing means connected to each of the logic circuits for increasing the second power supply voltage according to the state of an input signal in the operation mode; and first, second, third and fourth pseudo-power supply lines connected to each of the voltage decreasing means and the voltage increasing means. In this second semiconductor integrated circuit, a portion of the logic circuits is connected to each of the first and third pseudo-power supply lines, and the remaining portion of the logic circuits is connected to each of the second and fourth pseudo-power supply lines, and each of the voltage decreasing means and the voltage increasing means has a first switch connected between the first power supply line and the first pseudo-power supply line, a second switch connected between the first power supply line and the second pseudo-power supply line, a third switch connected between the second power supply line and the third pseudo-power supply line, a fourth switch connected between the second power supply line and the fourth pseudo-power supply line, a fifth switch connected between the first pseudo-power supply line and the fourth pseudo-power supply line, and a sixth switch connected between the second pseudo-power supply line and the third pseudo-power supply line.

In the second semiconductor integrated circuit, the voltage decreasing means is arranged to decrease the first power supply voltage according to the state of an input signal in the operation mode, and the voltage increasing means is arranged to increase the second power supply voltage according to the state of an input signal in the operation mode. In the voltage decreasing means and the voltage increasing means, the first and fourth pseudo-power supply lines are brought into a floating state from the power supply voltage, by turning off, for example, the first and fourth switches, and each of the first and fourth pseudo-power supply lines is set to a potential having an intermediate value between the first power supply voltage serving as the higher-side potential and the second power supply voltage serving as the lower-side potential, by turning on the fifth switch. Accordingly, when this intermediate potential is applied to each element which is included in the plurality of elements and which is substantially brought into a cutoff state, this reduces a feedthrough leak current generated in the logic circuits in the operation mode. The potential having an intermediate value between the first and second power supply voltages is being decreased with respect to the first power supply voltage, and increased with respect to the second power supply voltage. Thus, based on logics entered into the logic circuits, the logic circuits can be divided into one logic circuit group to be driven by the first and third pseudo-power supply lines, and the other logic circuit group to be driven by the second and fourth pseudo-power supply lines. Accordingly, each logic circuit to be cut off in the operation mode and each logic circuit to be operated in the operation mode, can be included in one logic circuit group and the other logic circuit group, respectively. It is therefore possible to change the operational voltage of each logic circuit to be cut off in the operation mode such that the element drive ability is decreased. This results in a reduction in leak current in the operation mode.

Further, in each logic circuit, the value of either higher-side potential or lower-side potential has a logic and the potential of each element in the cutoff state is set to an intermediate potential. This hastens determination of the logic when an operation starts, enabling the circuit operation to be executed at higher speed.

In the second semiconductor integrated circuit, the first to sixth switches are preferably controlled by an input signal in the operation mode. With such an arrangement, the voltage decreasing means and the voltage increasing means are securely controlled according to the logic value entered in the operation mode.

In the second semiconductor integrated circuit, the first power supply voltage preferably has the power supply potential, and the second power supply voltage preferably has the grounding potential.

In the second semiconductor integrated circuit, each of the logic circuits preferably comprises two field-effect transistors different in conduction type from each other, and first inverters each of which is connected to the first and third pseudo-power supply lines and second inverters each of which is connected to the second and fourth pseudo-power supply lines, are preferably alternately connected serially to each other. With such an arrangement, in the plurality of alternately serially connected inverters, the logic is successively inverted in the direction from the input side to the output side. Accordingly, when the field-effect transistors of one conduction type are under operation, the field-effect transistors of the other conduction type are substantially cut off. Accordingly, when provision is made such that the potential of the pseudo-power supply line for driving the field-effect transistors of the other conduction type is set to a potential having an intermediate value between the first and second power supply voltages, there can be achieved a circuit capable of securely reducing the leak current in the operation mode. Therefore, when the semiconductor integrated circuit of the present invention is used for a high-load driver circuit for example, there can securely be achieved both a reduction in power consumption in operation mode and a high-speed operation.

BRIEF DESCRIPTION OF THE DRAWINGS

FIGS. 3(a) and 3(b) are circuit diagrams of a standby control circuit unit according to the first embodiment of the present invention, in which FIG. 3(a) shows a first standby control circuit and FIG. 3(b) shows a second standby control circuit;

DETAILED DESCRIPTION OF THE INVENTION

First Embodiment

The following description will discuss a first embodiment of the present invention with reference to attached drawings.

Figure 1:
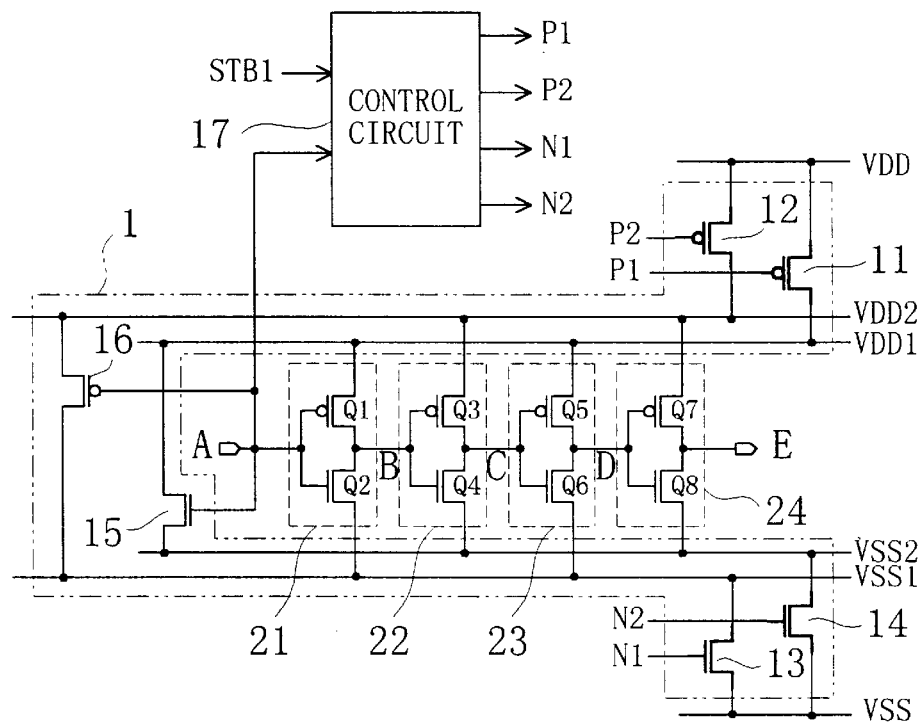
FIG. 1 is a circuit diagram of a semiconductor integrated circuit according to a first embodiment of the present invention.

FIG. 1 is a circuit diagram of a semiconductor integrated circuit according to a first embodiment of the present invention. In FIG. 1, voltage increasing and decreasing means 1 serving as power supply voltage changing means, is connected to a power supply line VDD to which applied is the power supply potential as a first power supply voltage, and to a grounding line VSS to which applied is the grounding potential as a second power supply voltage. Also, the voltage increasing and decreasing means 1 is connected to first to fourth inverters 21 to 24 which serve as logic circuits and which are serially connected in four stages.

The voltage increasing and decreasing means 1 comprises: a first P-FET switch transistor 11 connected between the power supply line VDD and a first pseudo-power supply line VDD1; a second P-FET switch transistor 12 connected between the power supply line VDD and a second pseudo-power supply line VDD2; a third N-FET switch transistor 13 connected between the grounding line VSS and a third pseudo-power supply line VSS1; and a fourth N-FET switch transistor 14 connected between the grounding line VSS and a fourth pseudo-power supply line VSS2. The voltage increasing and decreasing means 1 further comprises a fifth N-FET switch transistor 15 connected between the first pseudo-power supply line VDD1 and the fourth pseudo-power supply line VSS2 and a sixth P-FET switch transistor 16 connected between the second pseudo-power supply line VDD2 and the third pseudo-power supply line VSS1.

The first inverter 21 is arranged to receive an input signal A entered into its input terminal and comprises: a P-FET low-threshold transistor Q1 of which source node is connected to the first pseudo-power supply line VDD1; and an N-FET low-threshold transistor Q2 of which source node is connected to the third pseudo-power supply line VSS1. The second inverter 22 is arranged to receive an output signal B of the first inverter 21 and comprises: a P-FET low-threshold transistor Q3 of which source node is connected to the second pseudo-power supply line VDD2; and an N-FET low-threshold transistor Q4 of which source node is connected to the fourth pseudo-power supply line VSS2. The third inverter 23 is arranged to receive an output signal C of the second inverter 22 and comprises; a P-FET low-threshold transistor Q5 of which source node is connected to the first pseudo-power supply line VDD1; and an N-FET low-threshold transistor Q6 of which source node is connected to the third pseudo-power supply line VSS1. The fourth inverter 24 is arranged to receive an output signal D of the third inverter 23 and comprises; a P-FET low-threshold transistor Q7 of which source node is connected to the second pseudo-power supply line VDD2; and an N-FET low-threshold transistor Q8 of which source node is connected to the fourth pseudo-power supply line VSS2.

A control circuit 17 is arranged to receive the input signal A and a standby signal STB1 and to supply pseudo-power supply control signals P1, P2, N1, N2 for controlling the first to fourth switch transistors 11 to 14. Provision is made such that the pseudo-power supply control signal P1 is entered into the gate electrode of the first switch transistor 11, that the pseudo-power supply control signal P2 is entered into the gate electrode of the second switch transistor 12, that the pseudo-power supply control signal N1 is entered into the gate electrode of the third switch transistor 13, and that the pseudo-power supply control signal N2 is entered into the gate electrode of the fourth switch transistor 14. Similarly, the fifth and sixth switch transistors 15, 16 are also controlled by the input signal A.

The FETs forming the first to fourth inverters 21 to 24 are low-threshold FETs and can therefore be operated at high speed at a low voltage. On the other hand, each of the FETs forming the first to fourth switch transistors 11 to 14 has a high threshold so as to restrain a leak current.

Figure 2:
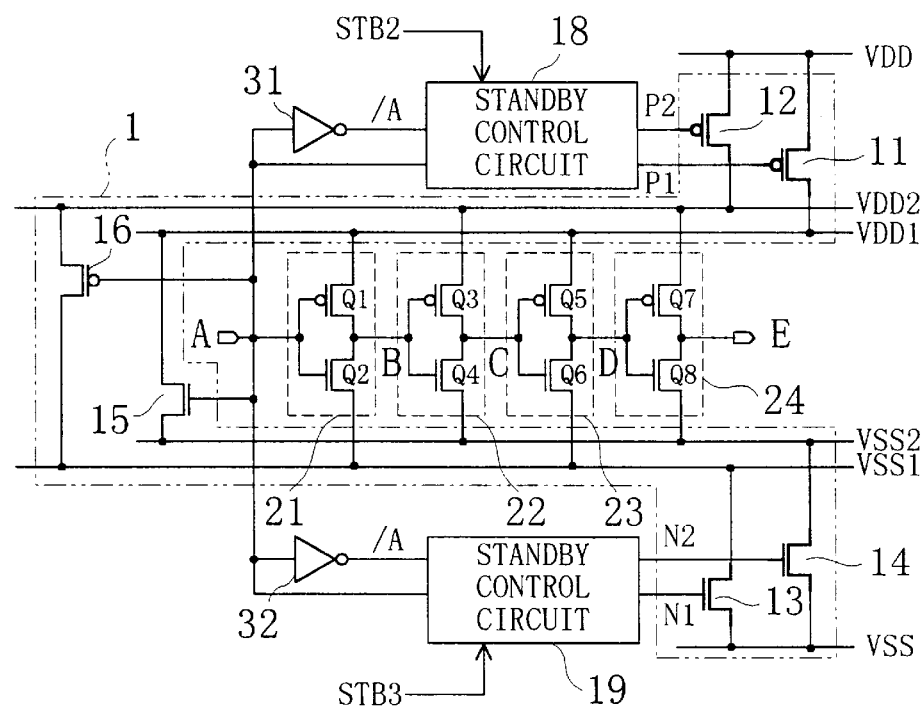
FIG. 2 is a circuit diagram of the semiconductor integrated circuit according to the first embodiment of the present invention.

FIG. 2 shows a specific example of the control circuit 17. As shown in FIG. 2, the control circuit 17 comprises a first voltage control inverter 31, a second voltage control inverter 32, a first standby control circuit 18 and a second standby control circuit 19. The first standby control circuit 18 is arranged to receive, in parallel, a standby signal STB2, the input signal A and an input inversion signal/A obtained by inverting the input signal A by the first voltage control inverter 31, and to supply the pseudo-power supply control signals P1, P2 to the voltage increasing and decreasing means 1. The second standby control circuit 19 is arranged to receive, in parallel, a standby signal STB3, the input signal A and an input inversion signal/A obtained by inverting the input signal A by the second voltage control inverter 32, and to supply the pseudo-power supply control signals N1, N2 to the voltage increasing and decreasing means 1.

Figure 3A:
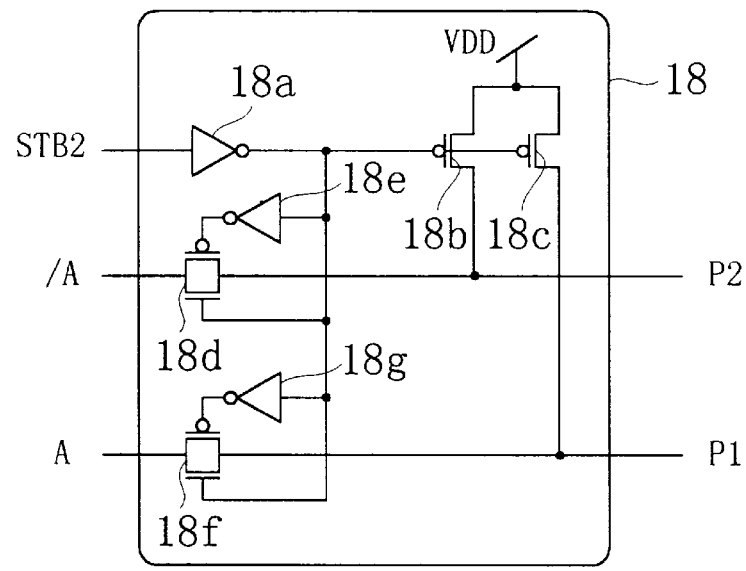
Figure 3B:
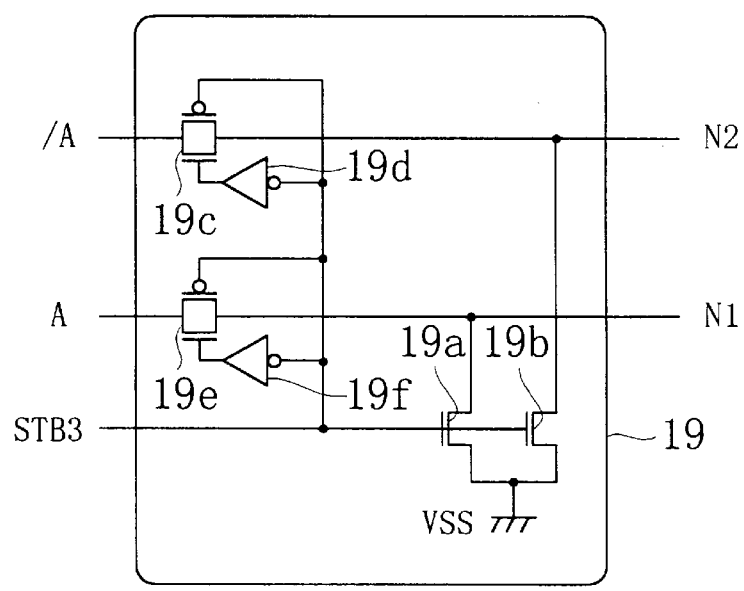

FIGS. 3(a) and 3(b) are circuit diagrams of a standby control circuit unit according to the first embodiment, in which FIG. 3(a) shows the first standby control circuit 18 and FIG. 3(b) shows the second standby control circuit 19. As shown in FIG. 3 (a), the first standby control circuit 18 comprises: a first inverter 18a arranged to receive the standby signal STB2, which is then inverted and supplied thereby; first and second PMOS switch transistors 18b, 18c which are controlled by an output signal of the first inverter 18a, of which source electrodes are connected to the power supply line VDD and of which drain electrodes are connected to output terminals; a first CMOS switch 18d which is controlled by the standby signal STB2 and which supplies the input inversion signal/A as the pseudo-power supply control signal P2; a second inverter 18e which receives an output of the first inverter 18a and which controls the P-side control terminal of the first CMOS switch 18d; a second CMOS switch 18f which is controlled by the standby signal STB2 and which supplies the input signal A as the pseudo-power supply control signal P1; and a third inverter 18g which receives an output signal of the first inverter 18a and which controls the P-side control terminal of the second CMOS switch 18f.

The second standby control circuit 19 comprises: first and second NMOS switch transistors 19a, 19b which are controlled by the standby signal STB3, of which source electrodes are connected to the grounding line VSS and of which drain electrodes are connected to output terminals; a first CMOS switch 19c which is controlled by the standby signal STB3 and which supplies the input inversion signal/A as the pseudo-power supply control signal N2; a first inverter 19d which is controlled by the standby signal STB3 and which controls the N-side control terminal of the first CMOS switch 19c; a second CMOS switch 19e which is controlled by the standby signal STB3 and which supplies the input signal A as the pseudo-power supply control signal N1; and a second inverter 19f which is controlled by the standby signal STB3 and which controls the N-side control terminal of the second CMOS switch 19e.

Referring to drawings, the following description will discuss the operation of the semiconductor integrated circuit having the arrangement above-mentioned.

When, in FIG. 2, at least one of the standby signals STB2, STB3, for example STB2, is brought into the high level in the standby mode, the first and second PMOS switch transistors 18b, 18c in FIG. 3(a) are conducted such that both the pseudo-power supply control signals P1, P2 are in the high level to turn off the first and second switch transistors 11, 12 in FIG. 2. This disconnects the current paths from the power supply line VDD to the grounding line VSS, thus reducing the leak current in the standby mode. Such an operation is similar to that in a conventional MTCMOS.

The following description will discuss the operation of the semiconductor integrated circuit in the operation mode. In the operation mode, both the standby signals STB2, STB3 are changed from the high level to the low level, enabling the pseudo-power supply control signals P1, P2, N1, N2 to be changed according to the input signal A.

In the operation mode, each of the first to fourth inverters 21 to 24 has two states, i.e., a first state in which the input signal A is in the high level and an output signal E is in the high level, and a second state in which the input signal A is in the low level and the output signal E is in the low level.

The following description will discuss the operation of the semiconductor integrated circuit when the state is changed from the first state to the second state.

In FIG. 2, when the input signal A is in the low level, the first inverter 21 is required to supply a signal in the high level. Accordingly, the pseudo-power supply control signal P1 is in the low level in synchronism with the input signal A. This causes the first pseudo-power supply line VDD1 to be in the high level, enabling the first inverter 21 to supply a signal in the high level. On the other hand, since the pseudo-power supply control signal P2 is in the high level, the second pseudo-power supply line VDD2 is in the floating state. Further, the pseudo-power supply control signal N2 is in the high level in synchronism with the input signal A and the potential of the fourth pseudo-power supply line VSS2 is equal to VSS. Accordingly, the second inverter 22 can receive a signal in the high level of the first inverter 21 and can supply a signal in the low level. At this time, since the pseudo-power supply control signal N1 is in the low level, the third pseudo-power supply line VSS1 is in the floating state. Likewise the first inverter 21, the third inverter 23 receives a signal in the low level and a potential in the high level of the first pseudo-power supply line VDD1, and supplies a signal in the high level. Likewise the second inverter 22, the fourth inverter 24 receives a signal in the high level and a potential in the low level of the fourth pseudo-power supply line VSS2, and supplies a signal in the low level.

That potential of each inverter which is not supplied, is independent of the logic (=output result) and is therefore not required to be equal to the power supply potential or grounding potential. Rather, as the difference between the power supply potential and the grounding potential which are applied to the first to fourth inverters 21 to 24, is smaller, the leak current is smaller, thus enabling the power consumption to be reduced.

Accordingly, when the input signal A is in the low level, the fifth switch transistor 15 is turned off and the sixth switch transistor 16 is also turned off. Since the fifth switch transistor 15 is turned off, the potential of the first pseudo-power supply line VDD1 and the potential of the fourth pseudo-power supply line VSS2 can be maintained at predetermined values, respectively.

Further, since the sixth switch transistor 16 is turned on, the second pseudo-power supply line VDD2 and the third pseudo-power supply line VSS1 are connected to each other and therefore short-circuited. The second pseudo-power supply line VDD2 is brought into the floating state from the power potential of the power supply line VDD and the third pseudo-power supply line VSS1 is brought into the floating state from the grounding potential of the grounding line VSS. These lines VDD2 and VSS1 are short-circuited and have the same potential. A third power supply voltage is obtained by decreasing the power supply potential of the power supply line VDD, and a fourth power supply voltage is obtained by increasing the grounding potential of the grounding line VSS. Each of the potentials serving as these third and fourth voltages becomes about an intermediate potential between the power supply potential and the grounding potential (hereinafter referred to as VDD/2). As a result, the power supply potential of the power supply line VDD is supplied to the first and third inverters 21, 23 at their power supply sides, and an intermediate potential VDD/2 is supplied to the first and third inverters 21, 23 at their grounding sides. The intermediate potential VDD/2 is supplied to the second and fourth inverters 22, 24 at their power supply sides and the grounding potential is supplied to the second and fourth inverters 22, 24 at their grounding sides. Accordingly, only a half potential-difference of a conventional one is applied to each of the inverters, thus considerably reducing the leak current.

In such a case, there is provided a current path from the power supply line VDD→the first switch transistor 11→the low-threshold transistor Q1 of the first inverter 21 and the low-threshold transistor Q5 of the third inverter 23→the low-threshold transistor Q2 of the first inverter 21 and the low-threshold transistor Q6 of the third inverter 23→the sixth switch transistor 16→the low-threshold transistor Q3 of the second inverter 22 and the low-threshold transistor Q7 of the fourth inverter 24→the low-threshold transistor Q4 of the second inverter 22 and the low-threshold transistor Q8 of the fourth inverter 24→the fourth switch transistor 14→the grounding line VSS. This increases the number of serially connected transistors as compared with a conventional arrangement, resulting in a reduction in leak current.

The following description will discuss the operation of the semiconductor integrated circuit when the state changes from the second state to the first state.

In FIG. 2, when the input signal A is in the high level, the first inverter 21 is required to supply a signal in the low level. Accordingly, the pseudo-power supply control signal N1 is in the high level in synchronism with the input signal A. Therefore, the third pseudo-power supply line VSS1 is conducted to the grounding line VSS and brought into the low level. This enables the first inverter 21 to supply a signal in the low level. At this time, since the pseudo-power supply control signal N2 is in the low level and the fourth switch transistor 14 is turned off, the fourth pseudo-power supply line VSS2 is in the floating state. Further, the pseudo-power supply control signal P2 is in the low level and the second pseudo-power supply line VDD2 is conducted to the power supply line VDD such that the potential of the line VDD2 becomes the power supply potential. Thus, the second inverter 22 receives a low-level signal of the first inverter 21 and supplies a high-level signal. At this time, since the pseudo-power supply control signal P1 is in the high level and the first switch transistor 11 is turned off, the first pseudo-power supply line VDD1 is in the floating state. Likewise the first inverter 21, the third inverter 23 receives a signal in the high level and a low-level potential of the third pseudo-power supply line VSS1, and supplies a signal in the low level. Likewise the second inverter 22, the fourth inverter 24 receives a signal in the low level and a high-level potential of the second pseudo-power supply line VDD2, and supplies a signal in the high level.

At this time, that potential of each inverter which is not supplied, is independent of the logic and is therefore not required to be equal to the power supply potential or grounding potential. Likewise in the second state, upon reception of the input signal A, the fifth switch transistor 15 is turned on and the sixth switch transistor 16 is turned off. This causes the first pseudo-power supply line VDD1 in the floating state and the fourth pseudo-power supply line VSS2 in the floating state to be short-circuited such that each of the potentials of the lines VDD1 and VSS2 becomes about the intermediate potential VDD/2.

In such a case, there is provided a current path from the power supply line VDD→the second switch transistor 12→the low-threshold transistor Q3 of the second inverter 21 and the low-threshold transistor Q7 of the fourth inverter 24→the low-threshold transistor Q4 of the second inverter 22 and the low-threshold transistor Q8 of the fourth inverter 24→the fifth switch transistor 15→the low-threshold transistor Q1 of the first inverter 21 and the low-threshold transistor Q5 of the third inverter 23→the low-threshold transistor Q2 of the first inverter 21 and the low-threshold transistor Q6 of the third inverter 23→the third switch transistor 13→the grounding line VSS.

Figure 4:
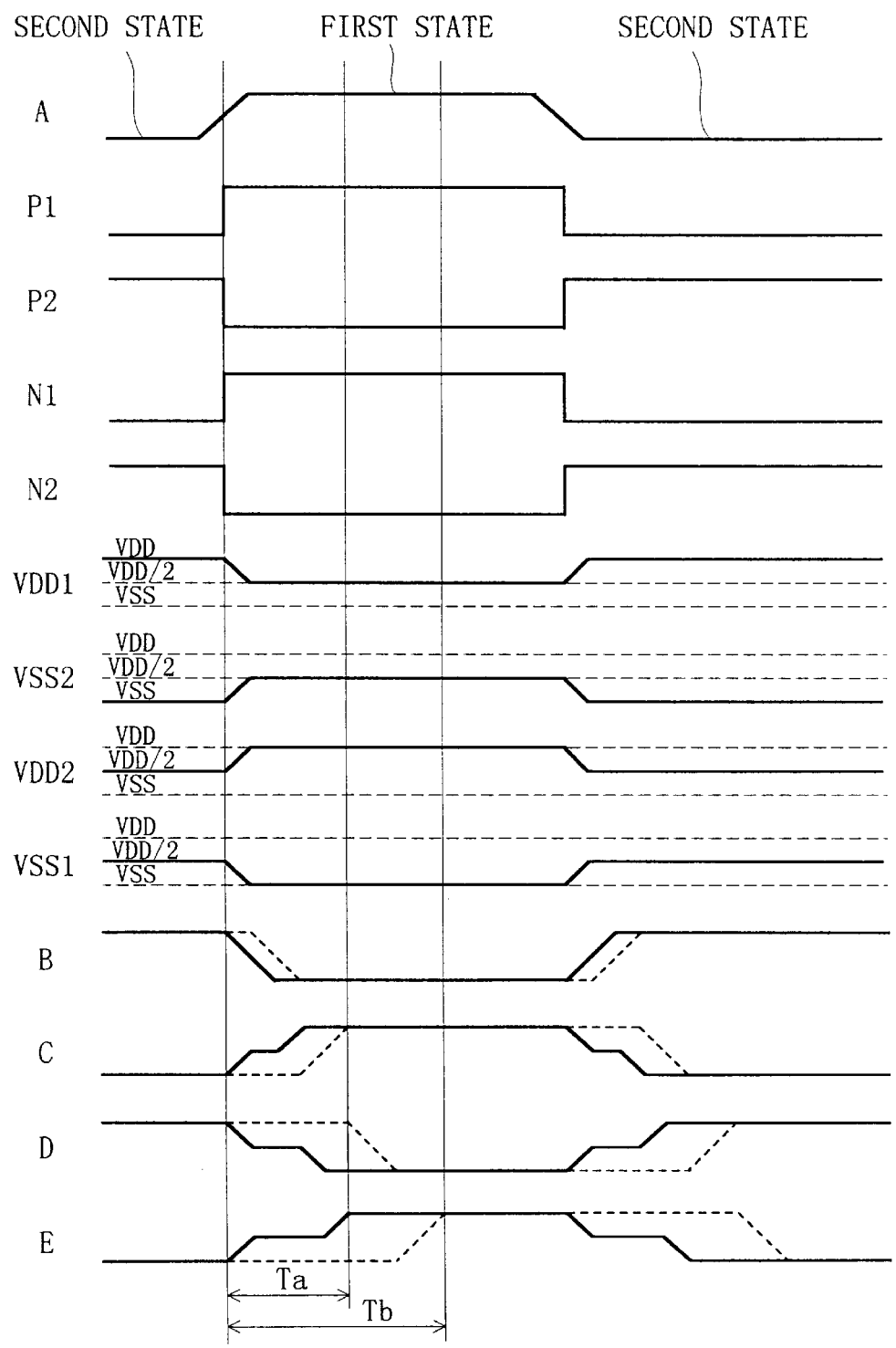
FIG. 4 is a timing chart of the semiconductor integrated circuit according to the first embodiment of the present invention.

FIG. 4 is a timing chart illustrating changes in signal in the first and second states. Since the first to sixth switch transistors 11 to 16 are controlled in synchronism with the input signal A, the timing at which the first pseudo-power supply line VDD1 and the fourth pseudo-power supply line VSS2 are short-circuited, is independent of the stage number of connected inverters and their delay times, and is faster than signal transmission.

The following description will discuss with attention placed to the output signal E of the fourth inverter 24. As shown in FIG. 4, when the state changes from the second state to the first state or when the input signal A changes from the low level to the high level, the sixth switch transistor 16 is conducted, and the first pseudo-power supply line VDD1 and the fourth pseudo-power supply line VSS2 are short-circuited before the signal having successively passed through the first inverter 21, the second inverter 22 and the third inverter 23, reaches the fourth inverter 24. Such short-circuiting relaxes the difference in potential between the first pseudo-power supply line VDD1 and the fourth pseudo-power supply line VSS2. Because of this relaxation, the intermediate potential VDD/2 is previously given to the fourth inverter 24. Thereafter, the fourth inverter 24 is increased in output to the potential VDD by the normal signal having passed through the first, second, third inverters 21, 22, 23, and then starts an output operation. Accordingly, since the potential of the fourth inverter 24 has previously been changed to the intermediate potential VDD/2, delay time Ta of the output signal E in the first embodiment shown by the solid line in FIG. 4, is shorter than delay time Tb in which delay times of output signals B, C, D shown by broken lines are being accumulated in a conventional circuit. Thus, the semiconductor integrated circuit can operate at high speed.

Such a high-speed operation is achieved based on timing of changes in normal signal transmission and pseudo-power supply voltage. As the stage number of the inverters forming the semiconductor integrated circuit is larger and as the delay times of the inverters are longer, the effect of high-speed operation is greater.

According to the first embodiment having the arrangement above-mentioned, the inverters as logic circuits in an even number are serially connected. Thus, there can be utilized the features that the input signal A and the output signal E are always equal in polarity to each other and that the polarity of each input signal is successively inverted in the direction from the input side to the output side. For example, when the input signal A is in the high level, the output signal B of the first inverter 21 and the output signal D of the third inverter 23 are always in the low level. Accordingly, it is enough that the source nodes of the first inverter 21 and the third inverter 23 are connected only to the grounding line VSS for supplying potential in the low level, and the source nodes of the inverters 21, 23 at the power supply line VDD sides thereof can be in the floating state. On the other hand, the output signal C of the second inverter 22 and the output signal E of the fourth inverter 24 are always in the high level. Accordingly, it is enough that the source nodes of the second inverter 22 and the fourth inverter 24 are connected only to the power supply line VDD for supplying potential in the high level, and the source nodes of the second inverter 22 and the fourth inverter 24 at the grounding line VSS sides thereof can be in the floating state. On the contrary, when the input signal A is in the low level, it is enough that the first inverter 21 and the third inverter 23 are connected only to the power supply line VDD for supplying potential in the high level, and the source nodes of the inverters 21, 23 at the grounding line VSS sides thereof can be in the floating state. Further, it is enough that the second inverter 22 and the fourth inverter 24 are connected only to the grounding line VSS for supplying potential in the low level, and the source nodes of the inverters 22, 24 at the power supply line VDD sides thereof can be in the floating state.

Further, according to the first embodiment, a reduction in leak current in the operation mode is compatible with a high-speed operation by short-circuiting the source nodes in the floating state at the grounding line VSS side to the source nodes at the power supply line VDD side. However, when provision is made such that the source nodes in the floating state at the grounding line VSS side remain in the floating state, a reduction in leak current in the operation mode can be achieved.

Provision may be made such that those source nodes of transistors which do not relate to signal output, are not brought into the floating state, and that the source nodes at the power supply line VDD side are lower than the power supply potential or the source nodes at the grounding line VSS side are higher than the grounding potential. Such an arrangement may also achieve a reduction in leak current in the operation mode.

Figure 5:
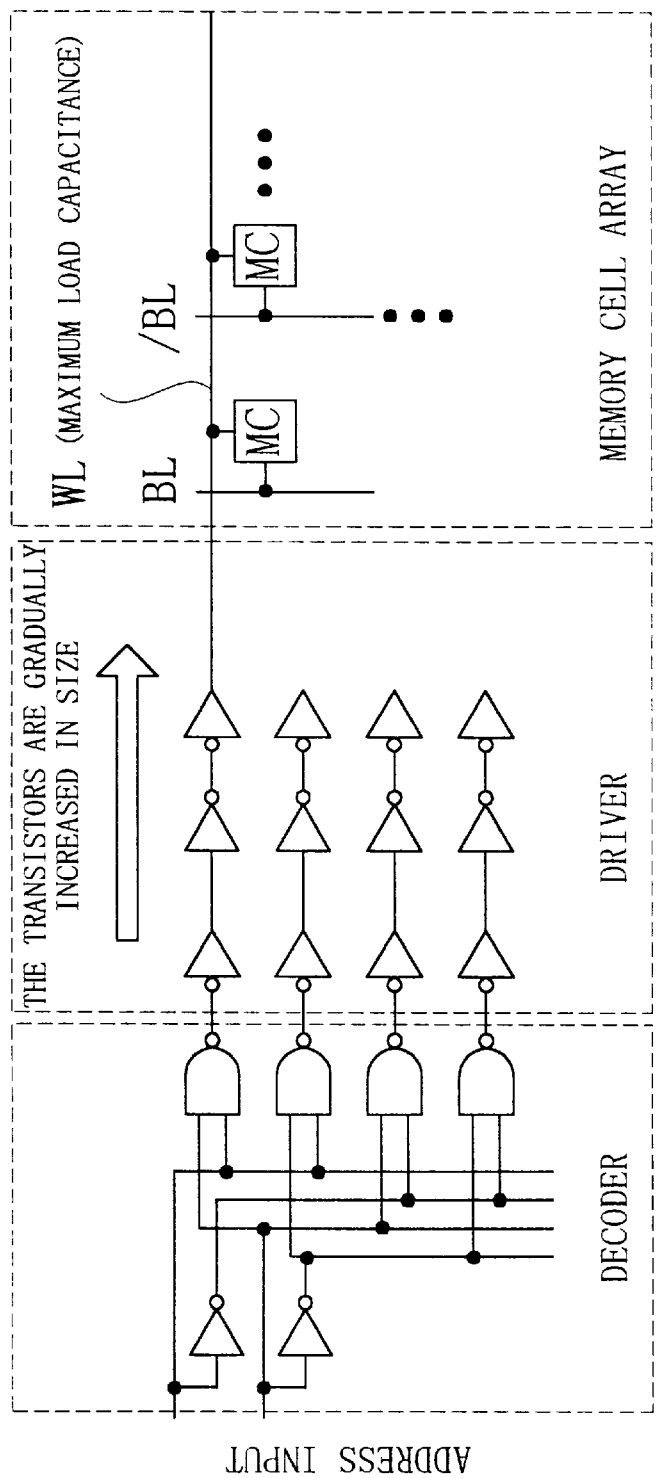
FIG. 5 is a schematic view of a driver circuit for driving memory cells in a semiconductor memory.

As discussed in the foregoing, the semiconductor integrated circuit of the first embodiment is effective particularly when a plurality stages of inverters are serially connected. As an example in which inverters are serially connected, FIG. 5 shows a driver circuit for driving a word line WL of a memory cell array. To drive a circuit of which load is extremely large such as a memory cell array, it is required to use transistors having sizes corresponding to the scale of the circuit. However, when large-size transistors are used as they are, it takes much time to drive the transistors, resulting in a failure to achieve a high-speed operation. In such a case, when the transistors are divided into several stages according to sizes and then successively driven starting with smallest transistors, the operation can be executed at higher speed.

Therefore, the first embodiment is effective particularly for a circuit using large-size transistors such as a driver circuit.

According to the first embodiment, inverters are used for logic circuits. However, the present invention can be applied to other logic circuits using no inverters. That is, when the source potentials of transistors which are substantially cut off, are changed according to the state of an input signal such that the leak current is reduced, there can be achieved a high-speed operation and a reduction in power consumption resulting from a reduction in leak current.

According to the first embodiment, there is used, as the power supply voltage changing means, the voltage increasing and decreasing means 1 which can increase and decrease a voltage. However, the power supply voltage changing means may be voltage decreasing means for decreasing the power supply voltage serving as a first power supply voltage, or voltage increasing means for increasing the grounding voltage serving as a second power supply voltage.

Further, provision may be made such that the third power supply voltage obtained by decreasing the power supply voltage and the fourth power supply voltage obtained by increasing the grounding voltage, are given from outside of the semiconductor integrated circuit.

Modification of the First Embodiment

Figure 6:
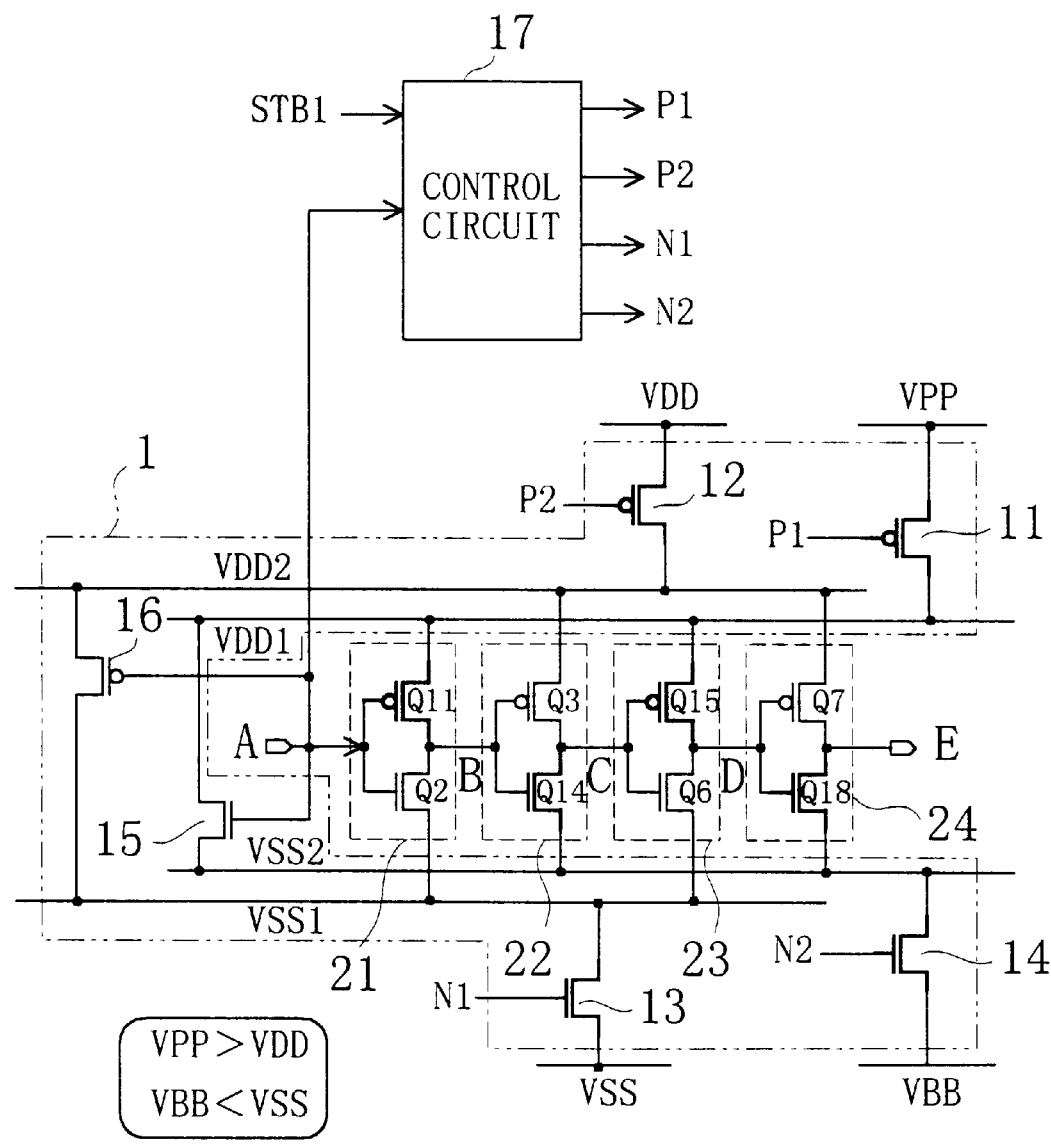
FIG. 6 is a circuit diagram of a semiconductor integrated circuit according to a modification of the first embodiment of the present invention.

Referring to drawings, the following description will discuss a modification of the first embodiment of the present invention:

FIG. 6 is a circuit diagram of a semiconductor integrated circuit according to the modification of the first embodiment of the present invention. Like parts in FIG. 6 are designated by like reference numerals used in FIG. 1, and the description thereof is here omitted. This modification is different from the first embodiment in the following three points. In the modification, (i) Q11 of the first inverter 21, Q14 of the second inverter 22, Q15 of the third inverter 23 and Q18 of the fourth inverter 24 are high-threshold transistors, (ii) the source nodes of P-type high-threshold transistors Q11, Q15 are connected, through the first switch transistor 11, to a high-potential power supply line VPP of which potential is higher than the potential of the power supply line VDD, and (iii) the source nodes of the N-type high-threshold transistors Q14, Q18 are connected, through the fourth switch transistor 14, to a low-potential power supply line VBB of which potential is lower than the potential of the grounding line VSS. As shown in FIG. 2, provision may be made such that the control circuit 17 receives the input signal A, inverts the input signal A through the inverters 31, 32, supplies the inverted signals as the pseudo-power supply control signals P2, N2, and supplies the pseudo-power supply control signals P1, N1 as they are.

The following description will discuss the operation of the semiconductor integrated circuit having the arrangement above-mentioned.

In the standby mode, the pseudo-power supply control signals P1, P2, N1, N2 are operated to turn off at least one pair of the pair of the first and second switch transistors 11, 12 and the pair of the third and fourth switch transistors 13, 14. This disconnects the current path from the power supply line VDD to the low-potential power supply line VBB and the current path from the high-potential power supply line VPP to the grounding line VSS, thus reducing the leak current in the standby mode.

First, the following description will discuss the operation of the semiconductor integrated circuit when the state changes from the second state to the first state.

In FIG. 6, when the input signal A changes from the low level to the high level, the first inverter 21 is required to supply a signal in the low level. Since the pseudo-power supply control signal N1 is in the high level in synchronism with the input signal A, the third pseudo-power supply line VSS1 is conducted to the grounding line VSS, causing the potential of the line VSS1 to be in the low level. Therefore, the first inverter 21 can supply a signal in the low level. At this time, since the pseudo-power supply control signal N2 is in the low level and the fourth switch transistor 14 is turned off, the fourth pseudo-power supply line VSS2 is in the floating state. The pseudo-power supply control signal P2 is in the low level in synchronism with the input signal A, and the potential of the second pseudo-power supply line VDD2 is equal to the potential of the power supply line VDD. Accordingly, the second inverter 22 can receive a signal in the low level of the first inverter 21 and supply a signal in the high level. At this time, since the pseudo-power supply control signal P1 is in the high level and the first switch transistor 11 is turned off, the first pseudo-power supply line VDD1 is in the floating state. Likewise the first inverter 21, the third inverter 23 receives a low-level potential of the third pseudo-power supply line VSS1 and supplies a signal in the low level. Likewise the second inverter 22, the fourth inverter 24 receives a signal in the low level and a high potential of the second pseudo-power supply line VDD2, and supplies a signal in the high level.

At this time, that potential of each inverter which is not supplied, is independent of the logic and is therefore not required to be equal to the power supply potential or grounding potential. Upon reception of the input signal A, the fifth switch transistor 15 is turned on and the sixth switch transistor 16 is turned off. This causes the first pseudo-power supply line VDD1 in the floating state and the fourth pseudo-power supply line VSS2 in the floating state to be short-circuited such that each of the potentials of the lines VDD1 and VSS2 becomes about the intermediate potential VDD/2.

The high-threshold transistors Q11, Q15 connected to the first pseudo-power supply line VDD1 and the high-threshold transistors Q14, Q18 connected to the fourth pseudo-power supply line VSS2, have high thresholds such that an off-leak current hardly flows. This results in sharp decrease in off-leak current in the whole semiconductor integrated circuit. Further, the high-threshold transistors reduce the feedthrough current generated at the time when a logic value undergoes a change. Thus, the power consumption can securely be reduced.

Next, the following description will discuss the operation of the semiconductor integrated circuit when the state changes from the first state to the second state.

In the second state, too, operations similar to those in the first embodiment are executed to reduce the power consumption. According to this modification, to decrease the feedthrough leak current at the time of logic conversion, the high-threshold transistors Q11, Q14, Q15, Q18 are used for the respective inverters. Accordingly, the high-threshold transistors Q11, Q14, Q15, Q18 are cut off in the first state but contribute to charging and discharging of the output nodes of the inverters in the second state. Therefore, if the arrangement remains as in the first embodiment, the drive currents become insufficient. This takes much time for signal transmission and results in a failure to achieve a high-speed operation.

According to this modification, there is used, as the power supply potential to be supplied to the source nodes of the high-threshold transistors Q11, Q15, a voltage (hereinafter referred to as VPP) greater than the voltage applied to the power supply line VDD, and there is also used, as the grounding potential to be supplied to the source nodes of the high-threshold transistors Q14, Q18, a voltage (hereinafter referred to as VBB) smaller than the voltage applied to the grounding line VSS, thus assuring respective drive currents for the transistors Q11, Q15, Q14, Q18.

Figure 7:
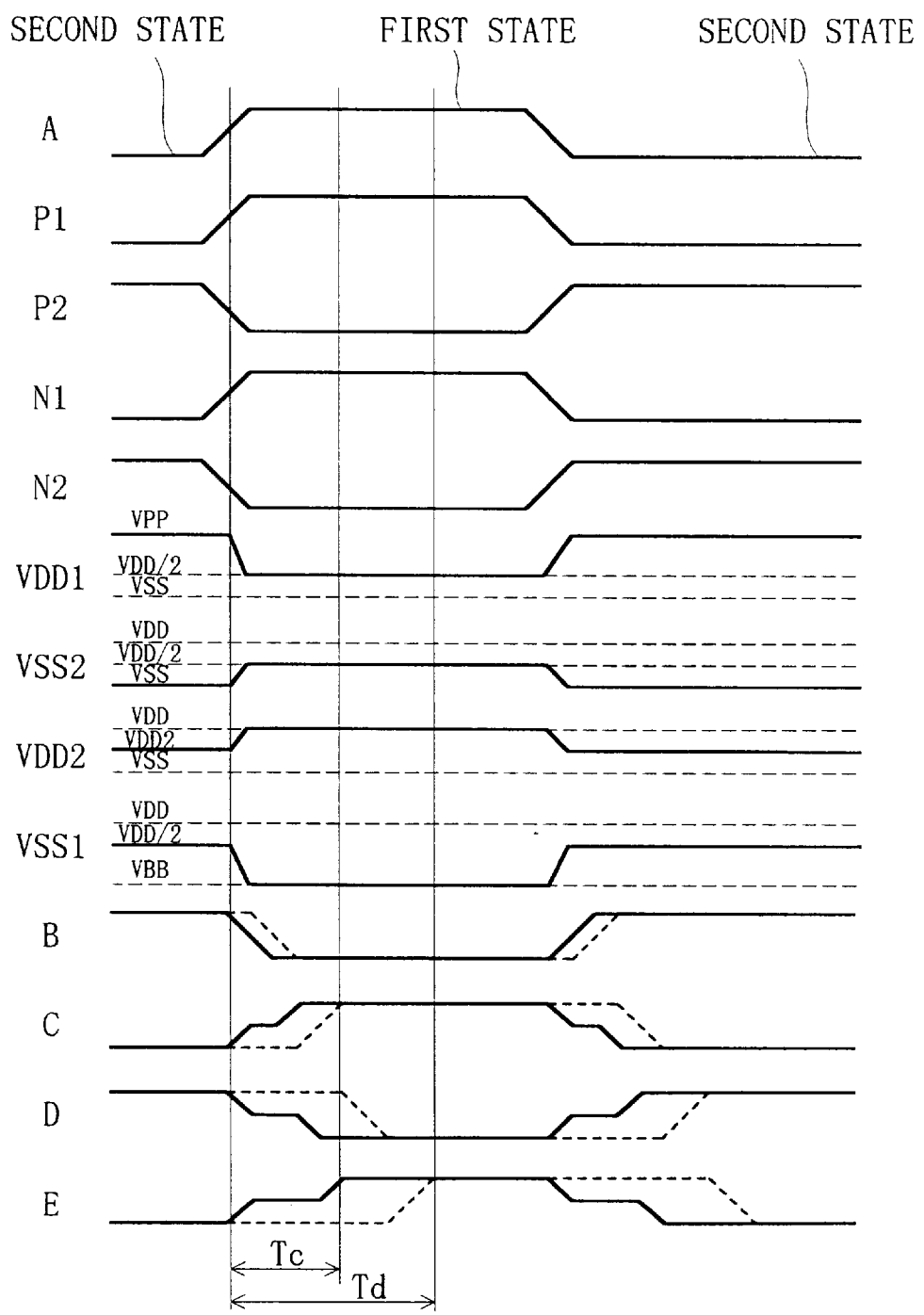
FIG. 7 is a timing chart of the semiconductor integrated circuit according to the modification of the first embodiment of the present invention.

Likewise the first embodiment, this modification achieves not only a reduction in leak current in the operation mode, but also a high-speed operation. The following description will discuss with attention placed to the output signal E of the fourth inverter 24. As shown by the timing chart in FIG. 7, when the state changes from the second state to the first state, the delay time Tc of the output signal E of this modification shown by a solid line, is shorter than delay time Td in the circuit of prior art shown by a broken line because the potential of the fourth inverter 24 of this modification has previously been changed to the intermediate potential (VPP+VDD)/2. This enables the semiconductor integrated circuit to be operated at high speed.

Thus, according to this modification, only the low-threshold transistors Q2, Q3, Q6, Q7 of the first to fourth inverters 21 to 24 are sensitized in the first state. Thus, even at a low voltage, drive currents are assured for the transistors Q2, Q2, Q6, Q7 and the source nodes of the high-threshold transistors Q11, Q14, Q15, Q18 which are cut off, are short-circuited, enabling the semiconductor integrated circuit to be operated at high speed.

On the other hand, there are instances where there is not used an inside power supply to be applied to the high-potential power supply line VPP or the low-potential power supply line VBB in order to avoid the complexity of designing and an increase in circuit scale. In such a case, there is the possibility for sluggishness of a transition to the second state where the input signal A changes in level from the high level to the low level.

In a digital circuit, however, high and low binary values are used and provision is often made such that either one represents ON while the other represents OFF. Now, a semiconductor memory circuit is taken as an example. An on-operation refers to an operation in which the semiconductor memory circuit is accessed by an external input and data are entered and supplied, and an off-operation refers to a reset operation in which the above-mentioned on-operation is reset for another on-operation. More specifically, in the semiconductor memory circuit, the speed of an on-operation is an important factor on which the performance or access time depends, but the speed of an off-operation is not so important as for an on-operation as far as the reset operation is executed to such an extent that does not interfere with another on-operation.

Thus, according to the semiconductor integrated circuit of this modification, a reduction in power consumption in the operation mode can be compatible with substantial high-speed operation when an on-operation is allocated to a logic in which a high-speed operation is executed by low-threshold transistors, and an off-operation is allocated to a logic in which a low-speed operation is executed by high-threshold transistors.

The potentials of the inside power supplies to be applied to the high-potential power supply line VPP and low-potential power supply line VBB connected to the high-threshold transistors, compensate for the low speed of the high-threshold transistors. It is therefore possible to control the speed of the high-threshold transistors by changing, according to the required specifications, the potentials to be set.

Second Embodiment

Referring to drawings, the following description will discuss a second embodiment of the present invention.

According to the semiconductor integrated circuit of the modification of the first embodiment, an on-operation is allocated to a logic in which a high-speed operation is executed by low-threshold transistors, and an off-operation is allocated to a logic in which a low-speed operation is executed by high-threshold transistors. That is, the semiconductor integrated circuit according to the modification is made for a circuit, e.g., a driver circuit for access to the memory, in which even though an off-operation is low in speed, this constitutes no hindrance. However, the second embodiment is made with the object of achieving both a high-speed operation and a reduction in power consumption in the operation mode regardless of an on- or off-operation.

Figure 8:
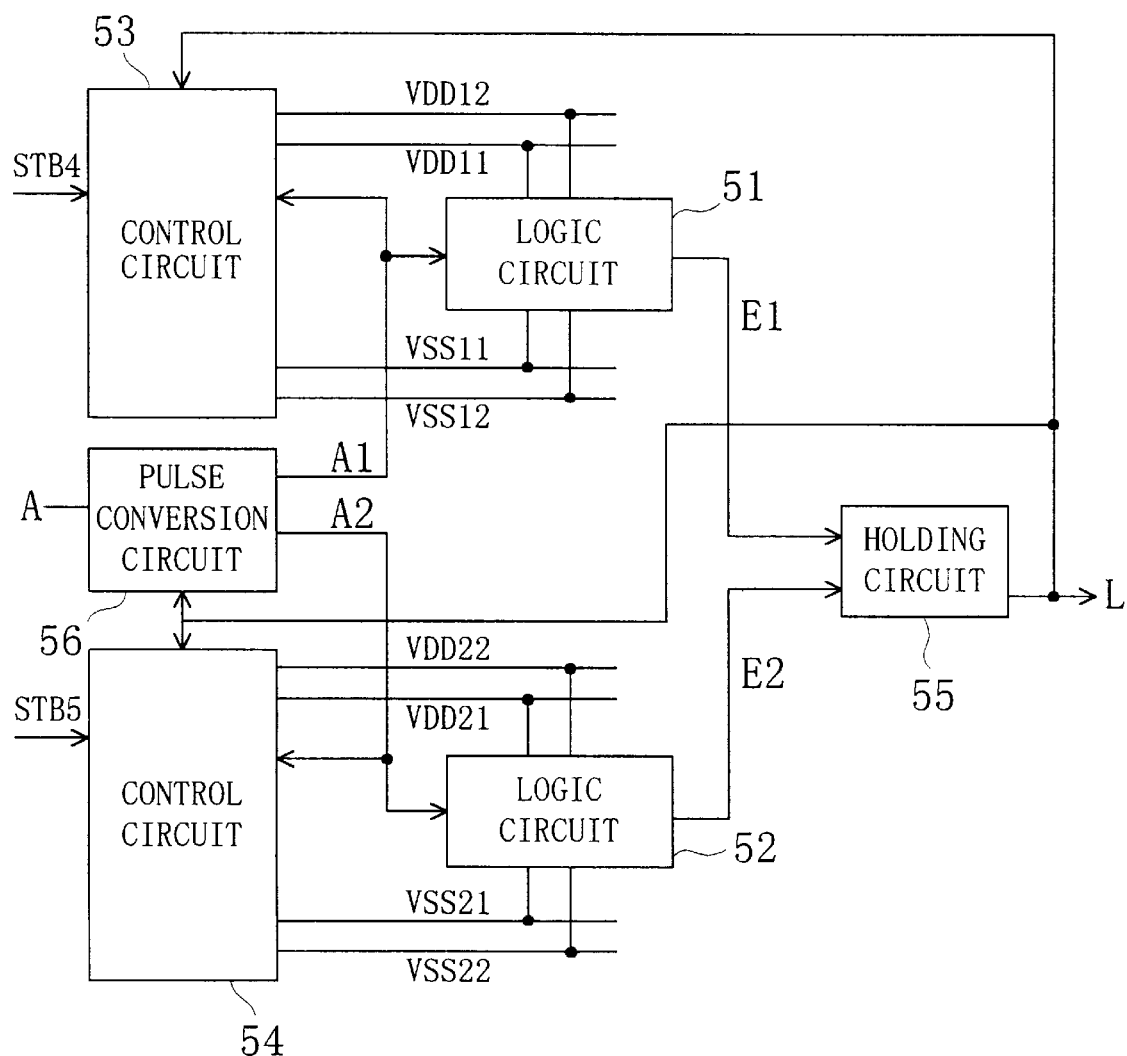
FIG. 8 is a block diagram of a semiconductor integrated circuit according to a second embodiment of the present invention.
Figure 9:
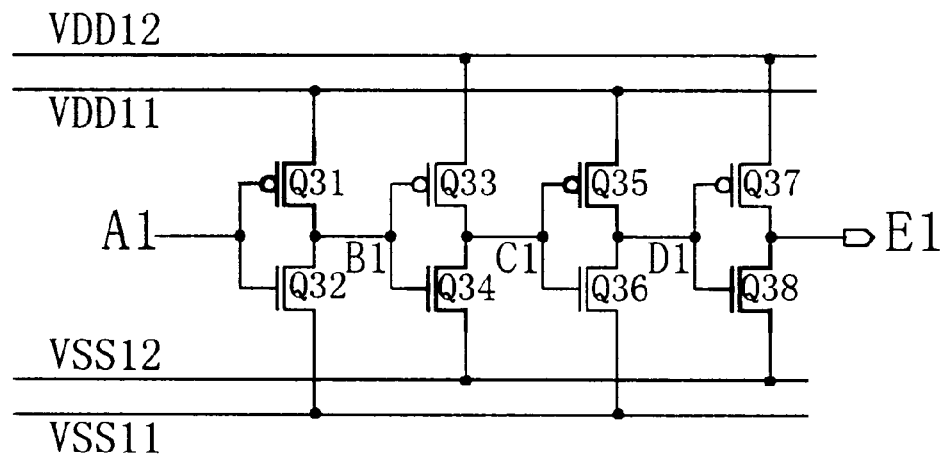
FIG. 9 is a circuit diagram of a first logic circuit in the semiconductor integrated circuit according to the second embodiment of the present invention.

FIG. 8 is a circuit block diagram of a semiconductor integrated circuit according to the second embodiment of the present invention. In FIG. 8, a first logic circuit 51 comprises serially connected inverters in four stages and is arranged to receive an input signal A1 and to supply an output signal E1. FIG. 9 shows the arrangement of the first logic circuit 51. As shown in FIG. 9, the first logic circuit 51 comprises: a first inverter which is arranged to receive the input signal A1 and which comprises a P-FET high-threshold transistor Q31 of which source node is connected to a first pseudo-power supply line VDD11, and an N-FET low-threshold transistor Q32 of which source node is connected to a third pseudo-power supply line VSS11; a second inverter which is arranged to receive an output signal B1 of the first inverter and which comprises a P-FET low-threshold transistor Q33 of which source node is connected to a second pseudo-power supply line VDD12, and an N-FET high-threshold transistor Q34 of which source node is connected to a fourth pseudo-power supply line VSS12; a third inverter which is arranged to receive an output signal C1 of the second inverter and which comprises a P-FET high-threshold transistor Q35 of which source node is connected to the first pseudo-power supply line VDD11, and an NFET low-threshold transistor Q36 of which source node is connected to the third pseudo-power supply line VSS11; and a fourth inverter which is arranged to receive an output signal D1 of the third inverter and which comprises a P-FET low-threshold transistor Q37 of which source node is connected to the second pseudo-power supply line VDD12, and an N-FET high-threshold transistor Q38 of which source node is connected to the fourth pseudo-power supply line VSS12.

Figure 10:
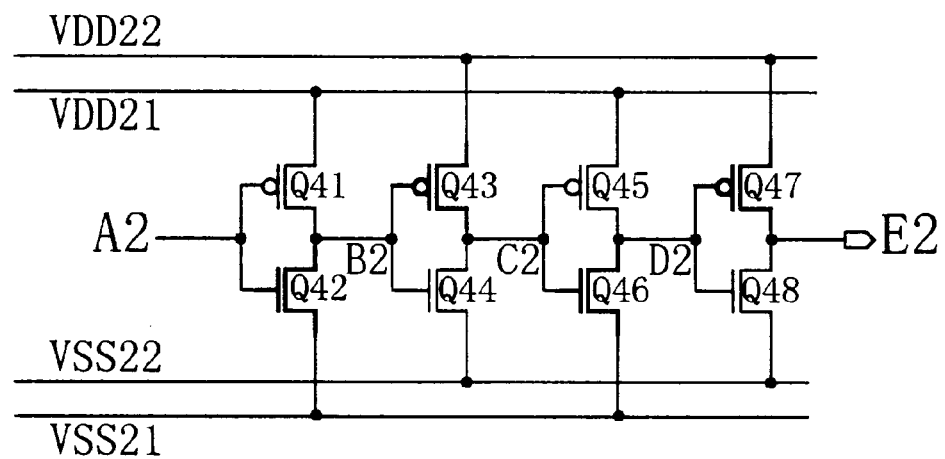
FIG. 10 is a circuit diagram of a second logic circuit in the semiconductor integrated circuit according to the second embodiment of the present invention.

A second logic circuit 52 comprises serially connected inverters in four stages and is arranged to receive an input signal A2 and to supply an output signal E2. FIG. 10 shows the arrangement of the second logic circuit 52. As shown in FIG. 10, the second logic circuit 52 comprises: a first inverter which is arranged to receive the input signal A2 and which comprises a P-FET low-threshold transistor Q41 of which source node is connected to a first pseudo-power supply line VDD21, and an N-FET high-threshold transistor Q42 of which source node is connected to a third pseudo-power supply line VSS21; a second inverter which is arranged to receive an output signal B2 of the first inverter and which comprises a P-FET high-threshold transistor Q43 of which source node is connected to a second pseudo-power supply line VDD22, and an N-FET low-threshold transistor Q44 of which source node is connected to a fourth pseudo-power supply line VSS22; a third inverter which is arranged to receive an output signal C2 of the second inverter and which comprises a P-FET low-threshold transistor Q45 of which source node is connected to the first pseudo-power supply line VDD21, and an N-FET high-threshold transistor Q46 of which source node is connected to the third pseudo-power supply line VSS21; and a fourth inverter which is arranged to receive an output signal D2 of the third inverter and which comprises a P-FET high-threshold transistor Q47 of which source node is connected to the second pseudo-power supply line VDD22, and an N-FET low-threshold transistor Q48 of which source node is connected to the fourth pseudo-power supply line VSS22. Accordingly, the first and second logic circuits 51, 52 are reversed in the combination of high-threshold transistors and low-threshold transistors.

A first control circuit 53 is formed by the peripheral circuits of the semiconductor integrated circuit in FIG. 1 except the first to fourth inverters in four stages. The first control circuit 53 serves as a voltage control circuit to be controlled by the input signal A1 and an output signal L of a holding circuit 55 serving as an output signal holding circuit arranged to receive, hold and supply the output signal E1 of the first logic circuit 51 or the output signal E2 of the second logic circuit 52. The first control circuit 53 controls the potentials of the first pseudo-power supply line VDD11, the second pseudo-power supply line VDD12, the third pseudo-power supply line VSS11 and the fourth pseudo-power supply line VSS12.

A second control circuit 54 is formed by the peripheral circuits of the semiconductor integrated circuit in FIG. 1 except the first to fourth inverters in four stages. The second control circuit 54 serves as a voltage control circuit to be controlled by the input signal A2 and the output signal L of the holding circuit 55. The second control circuit 54 controls the potentials of the first pseudo-power supply line VDD21, the second pseudo-power supply line VDD22, the third pseudo-power supply line VSS21 and the fourth pseudo-power supply line VSS22.

A pulse conversion circuit 56 is arranged to receive the output signal L and convert the input signal A into a signal pulse A1 having a pulse component in the high-level direction or a signal pulse A2 having a pulse component in the low-level direction.

The following description will discuss the operation of the semiconductor integrated circuit having the arrangement above-mentioned.

First, the following description will discuss the case where the input signal A changes in level from the low level to the high level.

The pulse conversion circuit 56 receives the input signal A in the high level and supplies the signal pulse A1 in the high level to the first control circuit 53. The first control circuit 53 causes the potential of the second pseudo-power supply line VDD12 to be changed to the potential of the power supply line VDD, causes the potential of the third pseudo-power supply line VSS11 to be changed to the potential of the grounding line VSS, and causes the potential of each of the first pseudo-power supply line VDD11 and the fourth pseudo-power supply line VSS12 to be changed to the intermediate potential VDD/2. At this time, the source potentials of the low-threshold transistors of the first logic circuit 51 become the high potential of the power supply line VDD or the low potential of the grounding line VSS, and the source potentials of the high-threshold transistors of the first logic circuit 51 become the intermediate potential VDD/2. Accordingly, the logic value is transmitted at high speed. Further, the intermediate potential VDD/2 is applied to the respective inverters. Therefore, the leak current is considerably small. Further, due to the high thresholds of the high-threshold transistors, there can be reduced a feedthrough leak current at a transitional period in which the logic value undergoes a change.

When the transmission of the logic value is finished and the output signal E1 of the first logic circuit 51 is changed to the high level, the holding circuit 55 holds the high-level value of the output signal E1 and supplies the output signal L. When the potential of the output signal E1 is held by the holding circuit 55, the output signal L controls the first control circuit 53, causing the state changing operation to the second state to start. More specifically, the second pseudo-power supply line VDD12 and the third pseudo-power supply line VSS11 are short-circuited such that the potential of each of the lines VDD12 and VSS11 is changed to the intermediate potential VDD/2. Further, the potential of the first pseudo-power supply line VDD11 is changed to the high potential of the power supply line VDD, and the potential of the fourth pseudo-power supply line VSS12 is changed to the potential of the grounding line VSS. Further, since the input signal A is changed to the signal pulse A1 by the pulse conversion circuit 56, the state changing operation to the second state starts in the output nodes of the respective inverters of the first logic circuit 51.

Since the state is changed from the first state to the second state by charging and discharging the high-threshold transistors, it is difficult to assure drive currents for the high-threshold transistors required for a high-speed operation. According to the second embodiment, however, even though the drive currents are not improved, the state changing operation starts earlier and the time margin allocated to the state changing operation can be enlarged, thus achieving a high-speed operation.

Next, the description will be made of the case where the input signal A is changed in level from the high level to the low level. The second logic circuit 52 executes an operation reversely of the first logic circuit 51. More specifically, the second control circuit 54 is controlled when the down-edge of the input signal A is detected, and the holding circuit 55 holds the output signal E2 of the second logic circuit 52 at the low level when the output signal E2 is brought into the low level.

Figure 11:
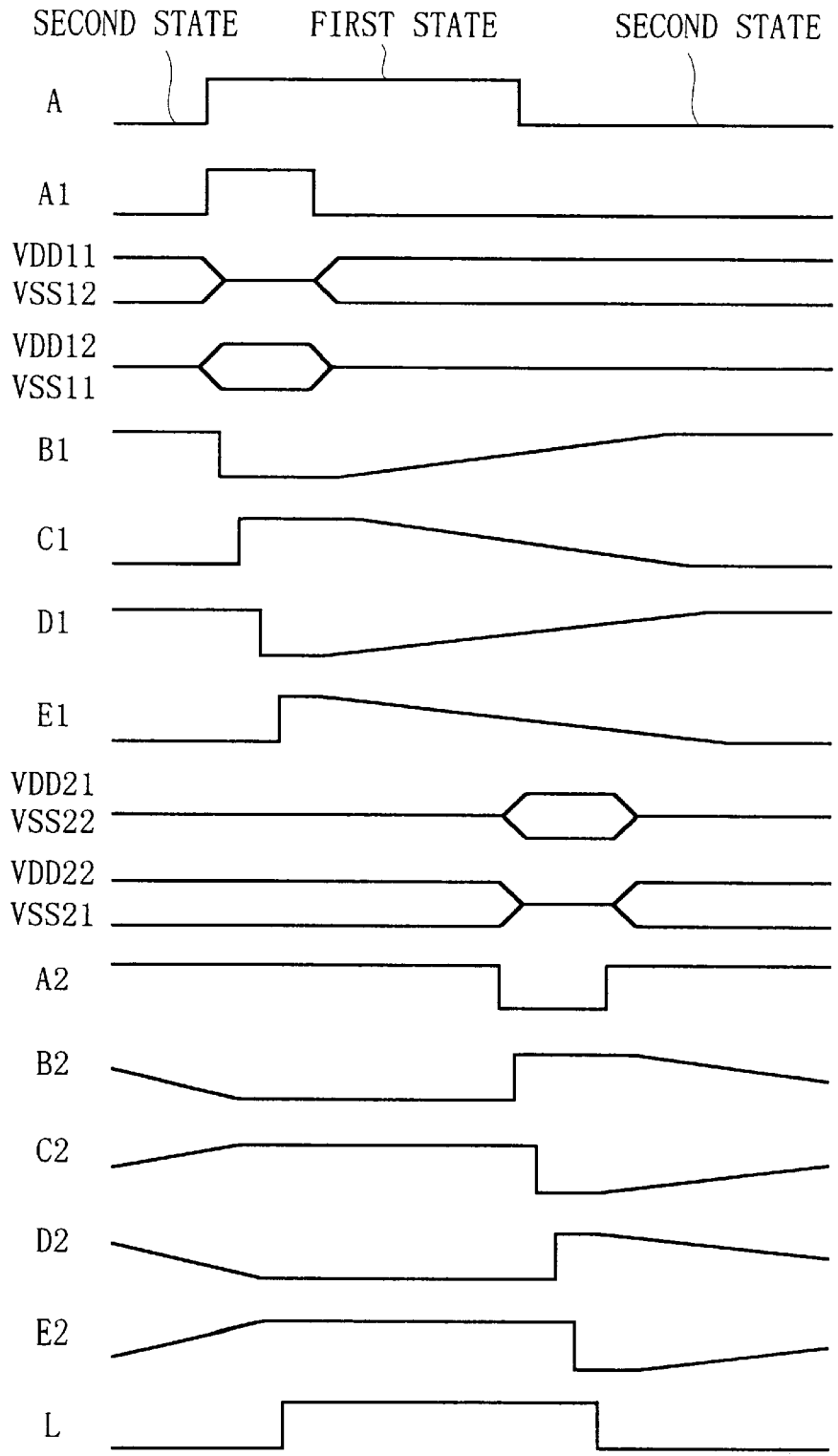
FIG. 11 is a timing chart of the semiconductor integrated circuit according to the second embodiment of the present invention.

As shown in the timing chart in FIG. 11, the holding circuit 55 acquires a signal corresponding to the input signal A in the high level when the holding circuit 55 detects the up-edge of the output signal E1 of the first logic circuit 51 and holds the output signal E1 in the high level. Also, the holding circuit 55 acquires a signal corresponding to the input signal A in the low level when the holding circuit 55 detects the down-edge of the output signal E2 of the second logic circuit 52 and holds the output signal E2 in the low level. Thus, the holding circuit 55 can securely supply the output signal L which is in synchronism with the input signal A.

Thus, with the use of neither voltage greater than the power supply voltage nor voltage smaller than the grounding voltage, the second embodiment achieves a high-speed operation at a low voltage with the power consumption reduced.

We claim:

1. A semiconductor integrated circuit comprising:

a logic circuit composed of a plurality of elements; and power supply voltage changing means for changing, based on the state of an input signal to said logic circuit in an operation mode, a power supply voltage of each element that has been brought substantially into a cutoff state, such that the drive ability of said element is reduced.

2. A semiconductor integrated circuit according to claim 1, wherein said power supply voltage changing means comprises:

a voltage decreasing unit connected to said logic circuit for decreasing, according to the state of an input signal in the operation mode, a first power supply voltage of each element which is included in said plurality of elements and which is substantially brought into a cutoff state, to a third power supply voltage such that the drive ability of said element is reduced; and a voltage increasing unit connected to said logic circuit for increasing, according to the state of an input signal in the operation mode, a second power supply voltage of each element which is included in said plurality of elements and which is substantially brought into a cutoff state, to a fourth power supply voltage such that the drive ability of said element is reduced.

3. A semiconductor integrated circuit according to claim 2, wherein the value of said third power supply voltage is equal to the value of said fourth power supply voltage.

4. A semiconductor integrated circuit according to claim 2, wherein said logic circuit is connected to a first power supply line to which said first power supply voltage is applied, and to a second power supply line to which said second power supply voltage is applied, and each of said voltage decreasing unit and said voltage increasing unit is connected between said first and second power supply lines and has a switch for opening and closing the electrical connection between said first and second power supply lines.

5. A semiconductor integrated circuit according to claim 2, further comprising:

a first power supply line to which said first power supply voltage is applied, and a second power supply line to which said second power supply voltage is applied; and first and second pseudo-power supply lines connected to each of said voltage decreasing unit and said voltage increasing unit, and wherein said logic circuit is connected to said first and second pseudo-power supply lines, and each of said voltage decreasing unit and said voltage increasing unit comprises a first switch connected between said first power supply line and said first pseudo-power supply line, a second switch connected between said second power supply line and said second pseudo-power supply line and a third switch connected between said first and second pseudo-power supply lines.

6. A semiconductor integrated circuit according to claim 2, wherein said first power supply voltage has the power supply potential, and said second power supply voltage has the grounding potential.

7. A semiconductor integrated circuit comprising:

a plurality of logic circuits each composed of a plurality of elements;

a first power supply line applied to which is a first power supply voltage higher than a grounding potential, and a second power supply line applied to which is a second power supply voltage lower than said grounding potential;

voltage decreasing means connected to each of said logic circuits for decreasing said first power supply voltage according to the state of an input signal to each of said logic circuits in an operation mode;

voltage increasing means connected to each of said logic circuits for increasing said second power supply voltage according to the state of the input signal to each of said logic circuits in the operation mode; and first, second, third and fourth pseudo-power supply lines connected to each of said voltage decreasing means and said voltage increasing means, a portion of said logic circuits being connected to each of said first and third pseudo-power supply lines, and a remaining portion of said logic circuits being connected to each of said second and fourth pseudo-power supply lines, each of said voltage decreasing means and said voltage increasing means comprising a first switch connected between said first power supply line and said first pseudo-power supply line, a second switch connected between said first power supply line and said second pseudo-power supply line, a third switch connected between said second power supply line and said third pseudo-power supply line, a fourth switch connected between said second power supply line and said fourth pseudo-power supply line, a fifth switch connected between said first pseudo-power supply line and said fourth pseudo-power supply line, and a sixth switch connected between said second pseudo-power supply line and said third pseudo-power supply line.

8. A semiconductor integrated circuit according to claim 7, wherein said first to sixth switches are controlled by an input signal in the operation mode.

9. A semiconductor integrated circuit according to claim 7, wherein said first power supply voltage has a power supply potential, and said second power supply voltage has the grounding potential.

10. A semiconductor integrated circuit according to claim 7, wherein each of said logic circuits comprises two field-effect transistors different in conduction type from each other, and each of first inverters is connected to said first and third pseudo-power supply lines and each of second inverters is connected to said second and fourth pseudo-power supply lines, said first inverters and said second inverters being alternately connected serially to each other.

* * * * *